United States Patent
Tan et al.

(10) Patent No.: US 10,431,158 B2
(45) Date of Patent: Oct. 1, 2019

(54) DISPLAY PANEL, MANUFACTURING METHOD AND DRIVE METHOD THEREOF, AND DISPLAY APPRATUS

(71) Applicant: BOE Technology Group Co., Ltd., Beijing (CN)

(72) Inventors: Jifeng Tan, Beijing (CN); Yafeng Yang, Beijing (CN); Xiaochuan Chen, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/788,057

(22) Filed: Oct. 19, 2017

(65) Prior Publication Data

US 2018/0114489 A1    Apr. 26, 2018

(30) Foreign Application Priority Data

Oct. 20, 2016    (CN) .......................... 2016 1 0916498

(51) Int. Cl.
  *G09G 3/3258*    (2016.01)
  *G09G 3/34*    (2006.01)
  (Continued)

(52) U.S. Cl.
  CPC ....... *G09G 3/3258* (2013.01); *G02F 1/13318* (2013.01); *G02F 1/13452* (2013.01);
  (Continued)

(58) Field of Classification Search
  CPC ..... G09G 2300/023; G09G 2300/0804; G09G 2300/046; G09G 3/3648;
  (Continued)

(56) References Cited

U.S. PATENT DOCUMENTS 6,025,894 A * 2/2000 Shirasaki .......... G02F 1/133555
                                                   349/61
2002/0047839 A1    4/2002 Kasai
(Continued)

FOREIGN PATENT DOCUMENTS

CN    1345021 A    4/2002
CN    1346153 A    4/2002
(Continued)

OTHER PUBLICATIONS

The First Office Action for Chinese Application No. 201610916498.5 dated Dec. 19, 2018.
(Continued)

*Primary Examiner* — Sanjiv D. Patel
(74) *Attorney, Agent, or Firm* — Fay Sharpe LLP

(57) ABSTRACT

The present disclosure relates to a display panel, a manufacturing method and a drive method thereof, and a display apparatus, in the field of display devices. The display panel comprises: an Organic Light-Emitting Diode panel and a reflecting Liquid Crystal Display panel arranged in a laminated mode, and a drive circuit, wherein the drive circuit is connected to the OLED panel and the reflecting LCD panel respectively; the drive circuit is used to drive the OLED panel or the reflecting LCD panel to display content in accordance with a control signal. The present disclosure solves the issue of display approach being relatively uniform by putting the OLED panel and the reflecting LCD panel together and controlling the OLED panel or the reflecting LCD panel to display content through the drive circuit.

18 Claims, 5 Drawing Sheets

(51) Int. Cl.
| | | |
|---|---|---|
| *G09G 3/36* | (2006.01) | |
| *G02F 1/133* | (2006.01) | |
| *G02F 1/1345* | (2006.01) | |
| *G09G 3/3233* | (2016.01) | |
| *H01L 27/32* | (2006.01) | |
| *H01L 51/52* | (2006.01) | |
| *G02F 1/1335* | (2006.01) | |
| *G02F 1/1368* | (2006.01) | |
| *G02F 1/1362* | (2006.01) | |

(52) U.S. Cl.
CPC ......... *G09G 3/3233* (2013.01); *G09G 3/3406* (2013.01); *G09G 3/3648* (2013.01); *G02F 1/1368* (2013.01); *G02F 1/133553* (2013.01); *G02F 1/136227* (2013.01); *G02F 1/136286* (2013.01); *G02F 2201/121* (2013.01); *G02F 2201/123* (2013.01); *G02F 2201/44* (2013.01); *G09G 2300/023* (2013.01); *G09G 2300/046* (2013.01); *G09G 2300/0426* (2013.01); *G09G 2300/0852* (2013.01); *G09G 2320/0626* (2013.01); *G09G 2330/021* (2013.01); *G09G 2354/00* (2013.01); *G09G 2360/144* (2013.01); *H01L 27/323* (2013.01); *H01L 51/5231* (2013.01); *H01L 2227/323* (2013.01)

(58) Field of Classification Search
CPC ............ G09G 2300/0408; G09G 3/36; G09G 3/3208; G09G 3/3688; G02F 1/133305; G06F 2203/04103
See application file for complete search history.

(56) References Cited

U.S. PATENT DOCUMENTS

| | | | |
|---|---|---|---|
| 2002/0070381 A1 | 6/2002 | Yamada et al. | |
| 2003/0052869 A1* | 3/2003 | Fujii | G02F 1/133555 345/204 |
| 2003/0193457 A1* | 10/2003 | Wang | G09G 3/20 345/84 |
| 2005/0007518 A1* | 1/2005 | Kato | G02F 1/133603 349/69 |
| 2005/0105033 A1* | 5/2005 | Itou | G02F 1/134363 349/141 |
| 2008/0238828 A1* | 10/2008 | Nakayama | G09F 9/35 345/76 |
| 2009/0244683 A1* | 10/2009 | Lan | G02B 26/001 359/263 |
| 2012/0287108 A1 | 11/2012 | Oh et al. | |
| 2014/0184577 A1* | 7/2014 | Kim | G09G 5/10 345/207 |
| 2014/0192295 A1* | 7/2014 | Wu | G02F 1/133711 349/69 |
| 2016/0267827 A1* | 9/2016 | Byun | G09G 3/3233 |
| 2017/0371171 A1 | 12/2017 | Xu et al. | |
| 2018/0107074 A1 | 4/2018 | Xu et al. | |

FOREIGN PATENT DOCUMENTS

| | | |
|---|---|---|
| CN | 1979915 A | 6/2007 |
| CN | 1981317 A | 6/2007 |
| CN | 201429935 Y | 3/2010 |
| CN | 201570230 U | 9/2010 |
| CN | 101981485 A | 2/2011 |
| CN | 102790074 A | 11/2012 |
| CN | 104020602 A | 9/2014 |
| CN | 104575408 A | 4/2015 |
| CN | 105607270 A | 5/2016 |
| CN | 205487282 U | 8/2016 |
| CN | 105974649 A | 9/2016 |
| TW | 201428398 A | 7/2014 |

OTHER PUBLICATIONS

Second office action of Chinese application No. 201610916498.5 dated May 22, 2019.

* cited by examiner

DISPLAY PANEL, MANUFACTURING METHOD AND DRIVE METHOD THEREOF, AND DISPLAY APPRATUS

The present disclosure claims priority to Chinese Patent Application No.: 201610916498.5, filed with the State Intellectual Property Office on Oct. 20, 2016 and titled "DISPLAY PANEL, MANUFACTURING METHOD AND DRIVE METHOD THEREOF, AND DISPLAY APPARATUS", the entire contents of which are incorporated herein by reference.

FIELD OF THE INVENTION

The present disclosure relates to a display device, particularly to a display panel, a manufacturing method and a drive method thereof, and a display apparatus.

BACKGROUND OF THE INVENTION

Currently, the display technologies mainly include two big categories: Organic Light-Emitting Diode (abbreviation: OLED) technology and Liquid Crystal Display (abbreviation: LCD) technology.

However, the display approach of the existing OLED display devices and LCD devices is relatively homogeneous.

SUMMARY OF THE INVENTION

The embodiment of the present disclosure provide a display panel, display panel manufacturing method and drive method thereof, and display apparatus, which solves the issue of display approach of display devices being relatively uniform. The technical solution is as follows:

In a first aspect, a display panel is provided by the embodiments of the present disclosure, the display panel comprising: an Organic Light-Emitting Diode panel and a reflecting Liquid Crystal Display panel arranged in a laminated mode, and a drive circuit, wherein the drive circuit is connected to the OLED panel and the reflecting LCD panel respectively; and the drive circuit is used to drive the OLED panel or the reflecting LCD panel to display according to a control signal.

In an embodiment of the present disclosure, the display panel comprising: a controller connected to the drive circuit; and the controller is used to acquire a user's input command, and to generate the control signal based upon the user's input command; or, to acquire brightness of external environment light; and generate the control signal based upon the brightness of the external environment light.

In another embodiment of the present disclosure, the display panel further comprising: a light sensor used to detect brightness of external environment light, wherein the controller is connected to the light sensor; and the controller generate a control signal for controlling the display of the reflecting LCD panel, when the brightness of external environment light is greater than a preset value, and to generate a control signal for controlling the display of the OLED panel, when the brightness of external environment light is less than a preset value.

In a further embodiment of the present disclosure, the OLED panel comprises a substrate, an anode, a luminescent layer, and a cathode arranged on the substrate in sequence and an encapsulation layer arranged on the substrate to encapsulate the anode, the luminescent layer, and the cathode; the reflecting LCD panel comprises a pixel electrode, an upper substrate, and liquid crystal arranged between the pixel electrode and the upper substrate, wherein the pixel electrode is arranged on the encapsulation layer; and the cathode of the OLED panel is the reflecting layer of the reflecting LCD panel.

In a further embodiment of the present disclosure, the reflecting LCD panel is a Twisted Nematic (TN) LCD panel, one side of the upper substrate close to the liquid crystal is provided with a common electrode, the drive circuit is used to input a common signal to the common electrode when the reflecting LCD panel displays contents, voltage of the common signal is the voltage of the common electrode; and the reflecting LCD panel is In Plane Switch (IPS) LCD panel or an Advanced-Super Dimensional Switching (ADS) LCD panel, the drive circuit is used to input a common signal to the anode when the reflecting LCD displays, voltage of the common signal is the voltage of the common electrode; an anode signal is input to the anode when the OLED panel displays, the anode signal is used to drive the luminescent layer.

In a further embodiment of the present disclosure, the substrate comprises a bottom substrate and a TFT circuit arranged on the bottom substrate; and the TFT circuit includes a plurality of parallel gate lines, a plurality of parallel data lines, a plurality of first transistors, a plurality of selective circuits, and a plurality of second transistors; the gate lines and data lines cross each other; a first transistor, a selective circuit, and a second transistor are placed at the crossing of each gate line and each data line; a gate of the first transistor is connected to the gate line, and a source of the first transistor is connected to the data line, a drain of the first transistor is connected to input end of the selective circuit; a first output end of the selective circuit is connected to a gate of the second transistor, a second output end of the selective circuit is connected to the pixel electrode, a control end of the selective circuit is connected to the drive circuit, the selective is used to connect the input end to the first output end or to the second output end with the control signal; a source of the second transistor is connected to the power voltage; a drain of the second transistor is connected to the anode; both the gate lines and the data lines are connected to the drive circuit.

In a further embodiment of the present disclosure, the selective circuit comprises P-type metal-oxide semiconductor field effect P-MOS transistor and an N-type metal-oxide semiconductor field effect N-MOS transistor; gate of the P-MOS transistor and gate of the -MOS transistor are connected to the drive circuit simultaneously to receive the control signal transmitted from the drive circuit, source of the P-MOS transistor and source of the N-MOS transistor are connected to the drain of the first transistor simultaneously, drain of the N-MOS transistor is connected to the pixel electrode, and drain of the P-MOS transistor is connected to gate of the second transistor.

In a further embodiment of the present disclosure, the TFT circuit is connected to the pixel electrode through wires arranged outside an encapsulation layer; or, the encapsulation layer is provided with VIAs, and the TFT circuit is connected to the pixel electrode through the VIAs.

In a second aspect, a display apparatus is provided, the display comprising the display panel of any of the claims in the first aspect.

In a third aspect, a display panel manufacturing method is provided by the embodiments of the present disclosure, the method comprising: arranging an OLED panel and a reflecting LCD panel in a laminated mode; and connecting the OLED panel and the reflecting LCD panel to a drive circuit, wherein the control circuit is used to drive the OLED panel or the reflecting LCD panel to display content in accordance with control signal.

In an embodiment of the present disclosure, the arranging the OLED panel and the reflecting LCD panel in a laminated mode comprises: manufacturing the OLED panel and the reflecting LCD panel respectively, wherein the reflecting LCD panel comprises bottom substrate; and stripping the bottom substrate off the reflecting LCD panel to make the LCD panel adhere to the OLED panel.

In another embodiment of the present disclosure, the connecting the OLED panel and the reflecting LCD panel to a drive circuit comprises: connecting pixel electrode of the reflecting LCD panel to the TFT circuit on the OLED panel through wires arranged outside an encapsulation layer after adhering the reflecting LCD panel to the OLED panel, wherein the TFT circuit is connected to the drive circuit.

In a further embodiment of the present disclosure, the arranging an OLED panel and a reflecting LCD panel in a laminated mode comprises: manufacturing the OLED panel; and manufacturing the reflecting LCD panel on the OLED panel.

In a further embodiment of the present disclosure, the liquid crystal is aligned through mixing polymers.

In a further embodiment of the present disclosure, the connecting the OLED panel and the reflecting LCD panel to a drive circuit comprises: connecting pixel electrode of the reflecting LCD panel to the TFT circuit on the OLED panel through wires arranged outside an encapsulation layer of the OLED panel, after the reflecting LCD panel is manufactured; or, manufacturing VIAs on the OLED panel before the reflecting LCD panel is manufactured, connecting the pixel electrode of the reflecting LCD panel to the TFT circuit on the OLED panel through the VIAs when manufacturing the reflecting LCD panel; and the TFT circuit is connected to the drive circuit.

In a fourth aspect, a method of driving the display panel provided in any embodiment of the first aspect, the method comprising: acquiring a control signal; and driving the OLED panel or the reflecting LCD panel to display content in accordance with the control signal.

In an embodiment of the present disclosure, the acquiring a control signal comprises: acquiring a use's input command and generating the control signal in accordance with the user's input command; or, acquiring brightness of external environment light, and generating a control signal in accordance with the brightness of external environment light.

In another embodiment of the present disclosure, the generating a control signal in accordance with brightness of external environment light comprises: generating a control signal for controlling the display of the reflecting LCD panel, when the brightness of external environment light is greater than a preset value; and generating a control signal for controlling the display of the OLED panel, when the brightness of external environment light is less than a preset value.

In a further embodiment of the present disclosure, the OLED panel comprises a substrate, an anode, a luminescent layer, and a cathode arranged on the substrate in sequence and an encapsulation layer arranged on the substrate to encapsulate the anode, the luminescent layer, and the cathode; the reflecting LCD panel is a Twisted Nematic LCD panel and comprises a pixel electrode, an upper substrate, and liquid crystal arranged between the pixel electrode and the upper substrate, the pixel electrode is arranged on the encapsulation layer, one side of the upper substrate close to the liquid crystal is provided with a common electrode; the method further comprises: inputting a common signal to the common electrode when the reflecting LCD panel displays, wherein voltage of the common signal is the voltage of the common electrode.

In a further embodiment of the present disclosure, the OLED panel comprises a substrate, an anode, a luminescent layer, and a cathode arranged on the substrate in sequence and an encapsulation layer arranged on the substrate to encapsulate the anode, the luminescent layer, and the cathode; the reflecting LCD panel is an IPS panel or an ADS LCD panel, and the reflecting LCD panel comprises a pixel electrode, an upper substrate, and liquid crystal arranged between the pixel electrode and the upper substrate, the pixel electrode is arranged on the encapsulation layer; the method further comprising: inputting a common signal to the anode when the reflecting LCD panel displays content, wherein voltage of the common signal is the voltage of the common electrode; and inputting an anode drive signal to the anode when the OLED panel displays, wherein the anode signal is used to drive the luminescent layer to emit light.

In a fifth aspect, the embodiments of the present disclosure provide a non-transitory readable storage medium comprising instructions executed on a processing component for performing the display panel drive method in the fourth aspect.

The technical solution provided by the present disclosure may include the following benefits:

the issue of display approach being relatively uniform is solved by putting the OLED panel and the reflecting LCD panel together and controlling the OLED panel or the reflecting LCD panel to display content through the drive circuit.

BRIEF DESCRIPTION OF THE DRAWINGS

To describe the technical solution in the embodiments of the present disclosure more clearly, the following briefly introduces the accompanying drawings required for describing the embodiments. Apparently, the accompanying drawings in the following description show merely some embodiments of the present disclosure, and a person of ordinary skill in the art may still derive other drawings from these accompanying drawings without creative efforts.

DETAILED DESCRIPTION OF THE EMBODIMENTS

The present disclosure will be described in further detail with reference to the enclosed drawings, to clearly present the objects, technique solutions, and advantages of the present disclosure.

Figure 1:
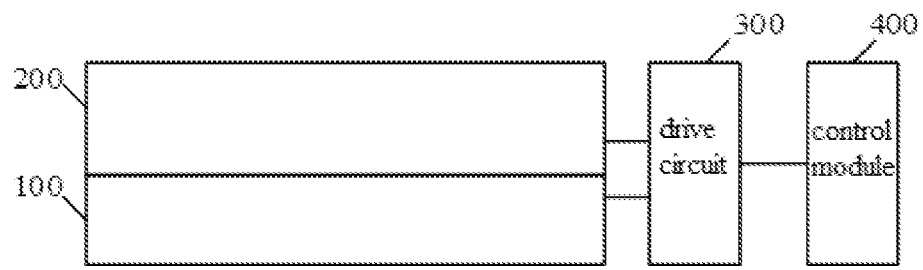
FIG. 1 is a schematically structural diagram of a display panel of the embodiments of the present disclosure.

FIG. 1 is a schematically structural diagram of a display panel of the embodiments of the present disclosure. Referring to FIG. 1, the display panel comprises: an Organic Light-Emitting Diode panel 100 and a reflecting Liquid Crystal Display panel 200 arranged in a laminated mode, and a drive circuit 300; the drive circuit 300 is connected to the OLED panel 100 and the reflecting LCD panel 200 respectively, and the drive circuit 300 is used to drive the OLED panel 100 or the reflecting LCD panel 200 to display content in accordance with a control signal.

The present disclosure solves the issue of display approach being relatively uniform by putting the OLED panel 100 and the reflecting LCD panel 200 together and controlling the OLED panel 100 or the reflecting LCD panel 200 to display content through the drive circuit 300.

Referring to FIG. 1 again, the display panel further comprises: a controller 400 connected to the drive circuit 300; the controller 400 is used to acquire a user's input command and generate the control signal based on the user's input command; or, the controller 400 acquires brightness of external environment light and generate the control signal based upon the brightness of the external environment light. That is to say, in the embodiment of the present disclosure, the controller 400 generates a control signal based on a user's input or the brightness of the external environment light, and transmits the control signal to the drive circuit 300 to control the OLED or the LCD to display content, thereby realizing the switching between the OLED panel and the LCD panel; the two methods of generating the control signal described above can manually or automatically control the display panel respectively.

When the controller 400 generates the control signal based on the brightness of the external environment light, the display panel further comprises: a light sensor connected to the controller 400. The light sensor is used to detect brightness of external environment light, and transmit the brightness of the external environment light as detected to the controller 400; the controller 400 is used to generate a control signal for controlling the display of the reflecting LCD panel 200, when the brightness of external environment light is greater than a preset value, and to generate a control signal for controlling the display of the OLED panel 100, when the brightness of external environment light is less than a preset value. Wherein, the preset value may be a predetermined brightness value. The reflecting LCD panel 200 can utilize the environment light to normally display images, when the value of the environment light brightness is the same as the preset value.

Since the reflecting LCD panel 200 can utilize the reflection of the environment light as the backlight, when the brightness of external environment light is relatively high, the reflecting LCD panel 200 is used for display because the reflecting LCD panel 200 does not have backlight and the energy required by backlight is saved so that the power consumption is low; when the brightness of external environment light is relatively low, the OLED panel 100 can be used for display to prevent the display panel from being unable to display content when only the reflecting LCD panel 200 is used; the display approach to use the combination of the reflecting LCD panel 200 and the OLED panel 100 can let the display panel select the reflecting LCD panel 200 for display when the environment light brightness is high and OLED panel 100 for display when the environment light brightness is low so that the average power consumption is lower than that of a regular LCD and OLED.

When the controller 400 generates the control signal based upon the user's input command, the display panel can also comprise: a user input module (not shown in FIG. 1) connected to the controller 400. The user input module is used to transmit user's input signal to the controller 400. The user input module can comprise at least one of following components: a control switch, a keyboard, a touch panel, etc.

Figure 2:
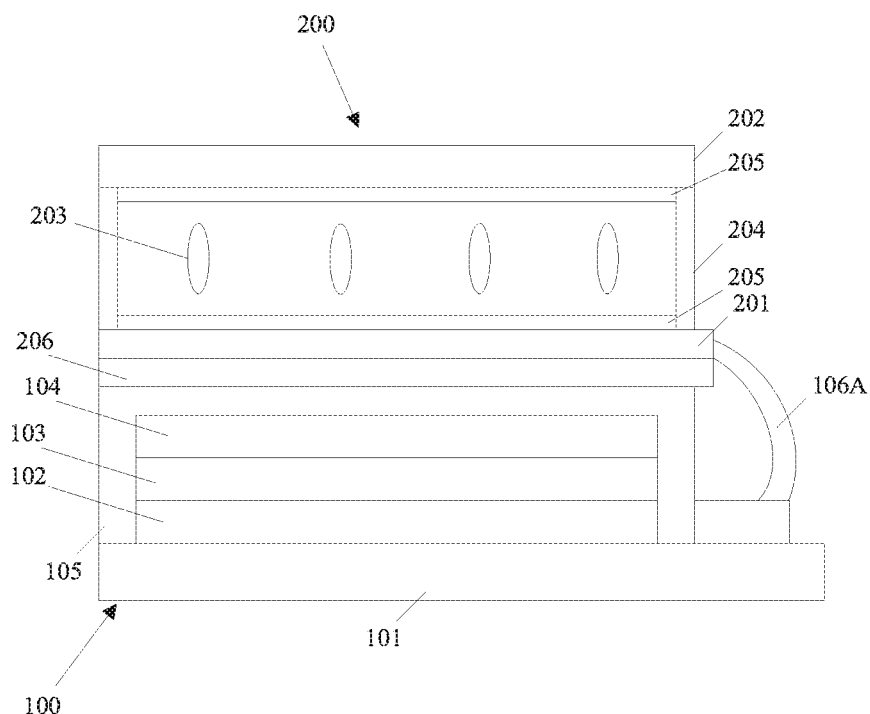
FIG. 2 is a schematically structural diagram of an OLED panel and a reflecting LCD panel among the display panels shown in FIG. 1.

FIG. 2 is a schematically structural diagram of the OLED panel 100 and the reflecting LCD panel 200 among the display panels shown in FIG. 1. Referencing to FIG. 2, the OLED panel 100 comprises a substrate 101, an anode 102, a luminescent layer 103, and a cathode 104 arranged on the substrate 101 in sequence, and an encapsulation layer 105 arranged on the substrate 101 to encapsulate the anode 102, the luminescent layer 103, and the cathode 104. The reflecting LCD panel 200 comprises a pixel electrode 201, an upper substrate 202, and liquid crystal 203 arranged between the pixel electrode 201 and the upper substrate 202. The pixel electrode 201 is arranged above the encapsulation layer 105; the cathode 104 of the OLED panel 100 is the reflecting layer of the reflecting LCD panel 200. Reusing the reflecting layer of the reflecting LCD and the cathode 104 of the OLED can save materials and reduce the thickness of the display panel.

The OLED panel 100 manufactured with the structure described above can be a top-emitting OLED (light emits from the top of the device) r a bottom-emitting OLED (light emits from the bottom of the device).

Wherein, the anode 102 may comprise an Indium Tin Oxide (ITO) wiring layer, an argentum (Ag) reflecting layer, and an ITO electrode layer arranged on the substrate 101 in sequence. Wherein the ITO wiring layer and the ITO electrode layer can be replaced with an Indium Zinc Oxide (170) wiring layer and an IZO electrode layer or other pairs. That is to say, the ITO wiring layer can be replaced with the IZO wiring layer, and the ITO electrode layer can be replaced with the IZO electrode layer.

Wherein, the cathode 104 can be manufactured with silver, sliver magnesium (Mg) alloy, etc.

Wherein, the pixel electrode 201 can be manufactured with transparent electrically conductive materials, for example, ITO or IZO film electrode.

Wherein, the encapsulation layer 105 is a transparent insulating layer, for example, silicon nitride layer, resin layer, etc. to achieve insulation protection and meanwhile enhance transparency.

Wherein, the upper substrate 202 is a colored film substrate. The colored film substrate usually comprises a bottom substrate, a color blocking layer, a black matrix, and some other structures.

Figure 3:
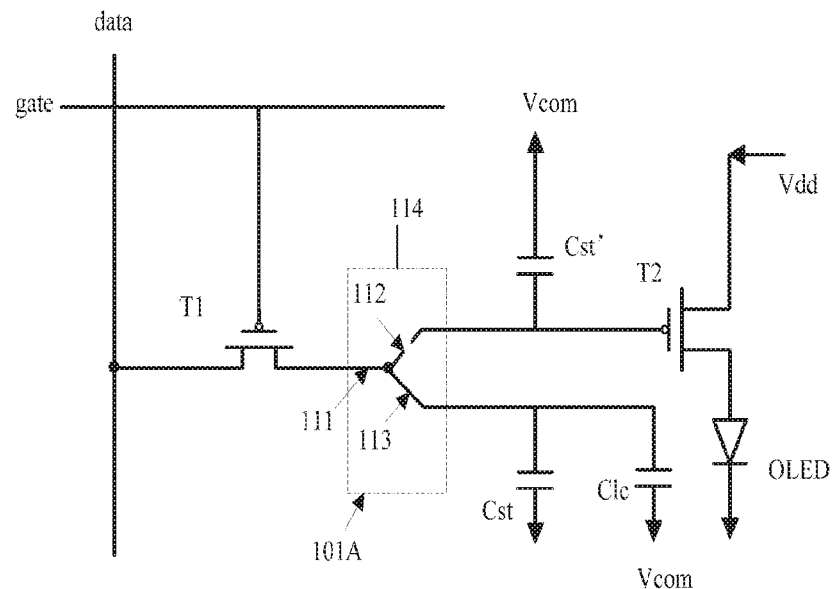
FIG. 3 is another schematically structural diagram of an OLED panel and a reflecting LCD panel among the display panels shown in FIG. 1.

In the embodiments of the present disclosure, when the reflecting LCD panel is a Twist Nematic (TN) LCD panel 200, as shown in FIG. 3, on the reflecting LCD panel, one side of the substrate 202 which is close to the liquid crystal 203 is provided with an independent common electrode 207. The common electrode 207 may be arranged between the upper substrate 202 and alignment layer 205 and connected to the drive circuit 300 (not shown in FIG. 3). The drive circuit 300 is used to input the common signal to the common electrode 207 when the reflecting LCD panel displays content, and the voltage of the common signal is the Vcom voltage of the common electrode. The common electrode 207 works together with the pixel electrode 201 to drive the deflection of liquid crystal 203.

When the reflecting LCD panel 200 is an In Plane Switch (IPS) or an Advanced—Super Dimension Switching (ADS) LCD panel 200, the drive circuit 300 is used to input a common signal to the anode 102 when the reflecting LCD panel displays content, and the voltage of the common signal is the Vcom voltage of the common electrode. Under this circumstance, the anode 102 can be used as the common electrode of the reflecting LCD panel and works together with the pixel electrode 201 to drive the deflection of liquid crystal 203 the drive circuit 300 is also used to input an anode signal to the anode 102 when the OLED panel 100 displays content, and the anode signal is used to drive the luminescent layer 103 to emit light. Reusing the common electrode of the reflecting LCD panel 200 and the anode 102 of the OLED panel 100 can reduce the thickness of the display panel and save materials since no common electrode is required to be arranged independently in the reflecting LCD panel 200.

In the embodiment, the substrate 101 may comprise a bottom substrate and a TFT circuit arranged on the bottom substrate. The TFT circuit is connected to the pixel electrode 201, the anode 102 and the drive circuit 300 respectively. The drive circuit 300 is used to transmit the control signal generated by the controller 400 to the TFT circuit, to drive the TFT circuit to control the OLCD panel 100 or the reflecting LED panel 200 to display content. The TFT circuit is connected to the pixel electrode 201, the anode 102 and the drive circuit 300 at the same time so that one TFT circuit can control the OLED panel 100 and the reflecting LCD panel 200 at the same time, thereby saving a TFT circuit for the reflecting LCD, and reducing the thickness of the display panel.

Wherein, the bottom substrate may be a glass substrate, a plastic substrate, a silicon substrate, etc.

Figure 4:
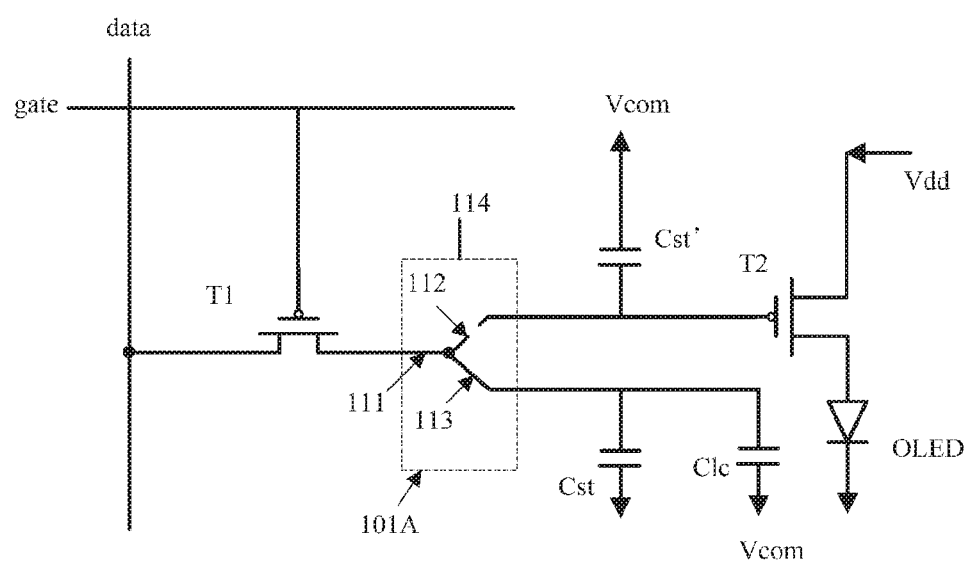
FIG. 4 is a circuit diagram of a TFT circuit of the embodiments of the present disclosure.

Wherein, the TFT circuit may include a plurality of parallel gate lines, a plurality of parallel data lines, a plurality of first transistors, a plurality of selective circuits, and a plurality of second transistors. FIG. 4 is the circuit diagram of a TFT circuit of the embodiments of the present disclosure (only partial TFT electrical circuit is illustrated). As shown in FIG. 4, the gate lines and data lines in the TFT circuit are arranged across each other. A first transistor T1, a selective circuit 101A, and a second transistor T2 are placed at the crossing of each gate line and each data line. The gate of the first transistor T1 is connected to the gate line. The source of the first transistor T1 is connected to the data line. The drain of the first transistor T1 is connected to input end 111 of the selective circuit 101A. The first output end 112 of the selective circuit 101A is connected to the gate of the second transistor T2. A second output end 113 of the selective circuit 101A is connected to the pixel electrode 211 of the LCD. In the circuit as shown in FIG. 4, the pixel electrode and the common electrode (anode 102 of OLED) from liquid crystal capacitance storage capacitance Clc, and pixel electrode and the wires of the common electrode or gate lines form storage capacitance Cst; in addition, as shown in FIG. 4, storage capacitance Cst' is formed between the gate of the second transistor T2 and the common electrode Vcom and the storage capacitance Cst' is used to store charge during the display of the OLED panel.

Control end 114 of the selective circuit 101A is connected to the drive circuit 300 and used to connect the input end 111 to the first output end 112 or to the second output end 113 with the control signal transmitted from the drive circuit 300. The source of the second transistor T2 is connected to the power with power voltage Vdd. The drain of the second transistor T2 is connected to the anode 102 of the OLED (not shown in the figure). Each gate line and each data line in the TFT circuit are connected to the drive circuit 300 which provides gate drive signals to all the gate lines and provides data signals to all the data lines. By adding the selective circuit 101A to the TFT circuit 101A, either OLED or LCD panel will be selected for display, a TFT electrical circuit in the reflecting LCD can be saved, and the thickness of the display panel can be reduced.

Figure 5:
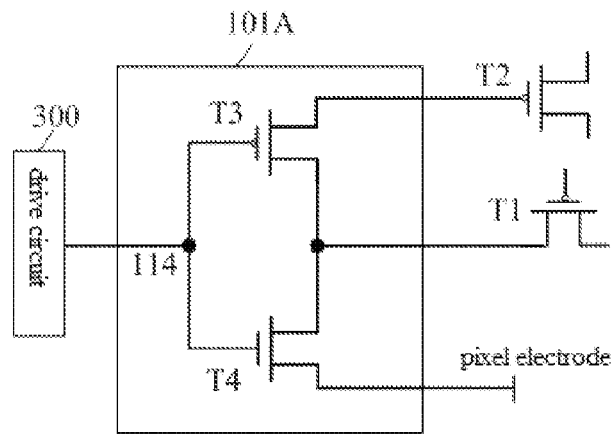
FIG. 5 is a circuit diagram of a selective circuit of the embodiments of the present disclosure.

FIG. 5 is a circuit diagram of a selective circuit of the embodiments of the present disclosure. As shown in FIG. 5, the selective circuit 101A comprises a P-type metal-oxide semiconductor field effect (P-MOS) transistor T3 and an N-type metal-oxide semiconductor field effect (N-MOS) transistor T4. The gate of the P-MOS transistor T3 and the gate of the N-MOS transistor T4 (the control end of the selective circuit 101A) are connected to the control signal at the same time. The source of the P-MOS transistor T3 and the source of the N-MOS transistor T4 (the input end of the selective circuit 101A) are connected to the drain of the first transistor T1 at the same time. The drain of the N-MOS transistor T4 (the second output end of the selective circuit 101A) is connected to the pixel electrode 201 (belonging to LCD). The drain of the P-MOS transistor T3 (the first output end of the selective circuit 101A) is connected to the gate of the second transistor T2 (belonging to OLED). Using the P-MOS transistor T3 and the N-MOS transistor T4 to select circuit 101 can allow different control signals to make P-MOS transistor T3 or the N-MOS transistor T4 conduct electricity so that either OLED or LCD panel 200 will be selected for display. For example, when the control signal provided by the controller 400 is a high-potential signal, the N-MOS transistor T4 will be conducted, the P-MOS transistor T3 will be turned off, the drain of the first transistor T1 is connected to the pixel electrode 102 and the data signals provided by the data lines data can charge the pixel electrode 102 to drive the LCD panel to display content; when the control signal provided by the controller 400 is a low-potential signal, the P-MOS transistor T3 will be conducted, the N-MOS transistor T4 will be turned off, the drain of the first transistor T1 is connected to the gate of the second transistor T2, and the data signals provided by the data lines data can drive the second transistor T2 to output drive current to OLED and drive the OLED panel to display content.

Figure 6:
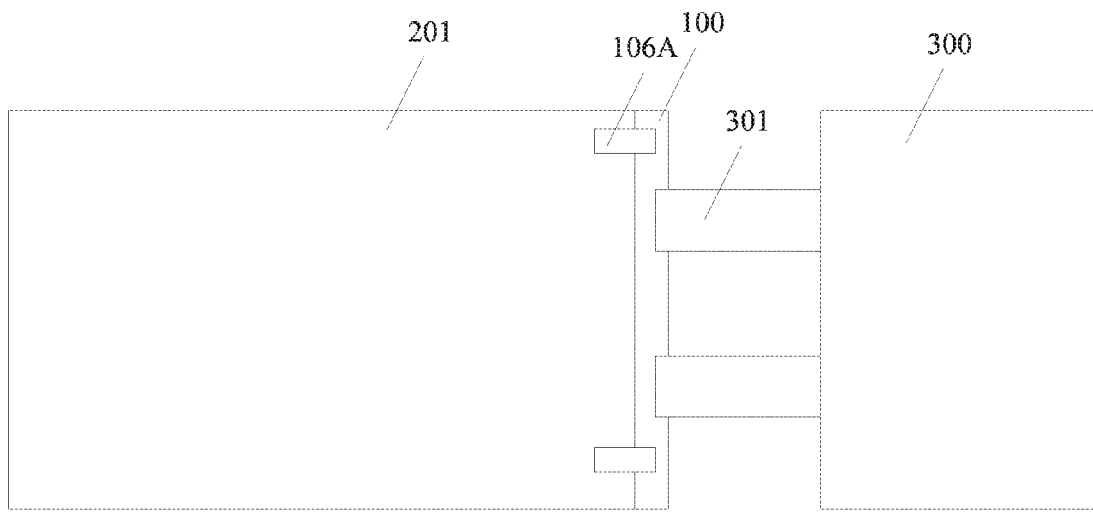
FIG. 6 is a top view of a display panel of the embodiments of the present disclosure.

Referring to FIG. 2 again, the display panel also comprises wires 106A located outside of the encapsulation layer 105. The TFT circuit is connected to the pixel electrode 201 through the wires 106A. FIG. 6 is the top view of the display panel of the embodiments of the present disclosure. Referencing to FIG. 6, the pixel electrode 201 is connected to the TFT circuit of the OLED panel 100 through the wires 106A. The drive circuit 300 is connected to the OLED panel 100 through signal line 301.

Figure 7:
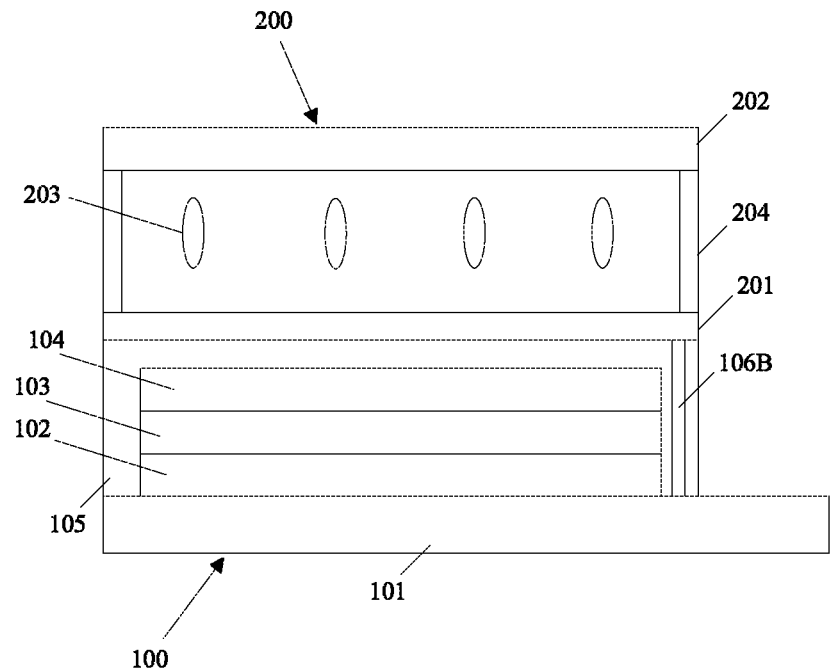
FIG. 7 is a further schematically structural diagram of an OLED panel and a reflecting LCD panel shown in FIG. 1.

FIG. 7 is another schematically structural diagram of the OLED panel 100 and the reflecting LCD panel 200 among the display panels in FIG. 1. Comparing with FIG. 2, the structure differences illustrated in FIG. 7 are that there are VIAs (vertical interconnect access) 106B on the encapsulation layer 105. The TFT circuit is connected to the pixel electrode 201 through the VIAs 106B and does not need to be connected to the pixel electrode 201 through external wires.

Among the display panels shown in FIG. 2 and FIG. 7, the reflecting LCD 200 is arranged on the encapsulation layer 105 of the OLED panel 100 so that it becomes easy to manufacture display panels. On the other hand, the wiring becomes easy as well. Of course, the reflecting LCD panel 200 can also be arranged on the substrate 101 of the OLED panel. That is to say, the OLED panel 100 can be arranged on the reflecting LCD panel 200. It is not explained in detail herein.

In the embodiments of the present disclosure, referring to FIG. 7, the reflecting LCD panel 200 can also comprise frame sealant 204. The frame sealant 204 is placed between the pixel electrode 201 and the upper substrate 202.

In an implementation of the embodiments of the present disclosure, as shown in FIG. 2, the reflecting LCD panel 200 can also comprise an alignment layer 205. The alignment layer 205 is arranged between the upper substrate 202 and the pixel electrode 201 and an alignment layer is placed on the pixel electrode 201 and the upper substrate 202 respectively. Specifically, referring to FIG. 2, an alignment layer 205 can be placed at the side of the pixel electrode 201 which is close to the liquid crystal and the side of the upper substrate 202 which is close to the liquid crystal respectively. The alignment layer 205 is used to align the liquid crystal 203. In another implementation of the embodiments of the present disclosure, the alignment can also be completed by adding high polymers into the liquid crystal 203.

In the embodiments of the present disclosure, as shown in FIG. 2, the reflecting LCD panel 200 can also comprise a soft substrate 206. The soft substrate 206 is used to make the manufactured reflecting LCD panel adhere directly to the OLED panel 100. The soft substrate 206 is a substrate made of polyimide and some other soft materials. The thickness of the soft substrate 206 is less than 10 micrometers. Its Phase retardation Rth is less than 100. Its transmittance is greater than 75%. The soft substrate 206 designed with the above characteristics has good transmittance. Color crossing does not happen easily.

A display apparatus is provided by the embodiments of the present disclosure. The display apparatus comprises a display panel shown in FIG. 1.

In the detailed implementation, the display apparatus of the embodiments of the present disclosure can be a mobile phone, a tablet, a TV, a display device, a laptop computer, a digital phone frame, a GPS, or any other products or parts with display functionality.

The present disclosure solves the issue of display approach being relatively uniform by putting the OLED panel and the reflecting LCD panel together and controlling the OLED panel or the reflecting LCD panel to display content.

Figure 8:
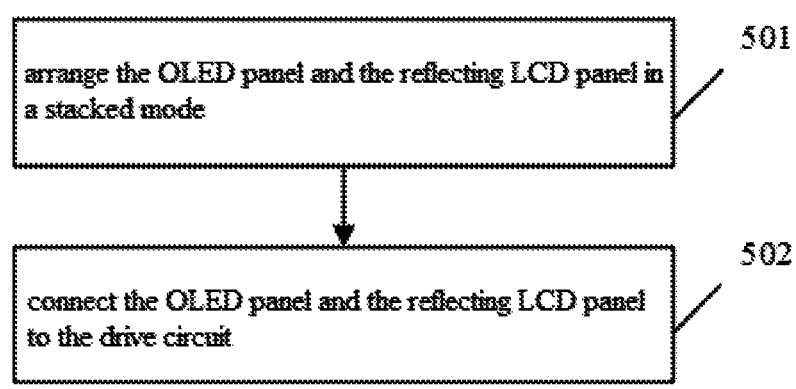
FIG. 8 is a flow diagram of a method of manufacturing a display panel of the embodiments of the present disclosure.

FIG. 8 is a flow diagram of a method of manufacturing a display panel in the embodiments of the present disclosure. The method is used to manufacture the display panel shown in FIG. 1. Referring to FIG. 8, the method comprises:

At step 501, arranging the OLED panel and the reflecting LCD panel in a laminated mode.

At step 502, the OLED panel and the reflecting LCD panel are connected to the drive circuit. The drive circuit is used to drive the OLED panel or the reflecting LCD panel to display content based upon the control signal.

The present disclosure solves the issue of display approach being relatively uniform by putting the OLED panel and the reflecting LCD panel together and controlling the OLED panel or the reflecting LCD panel to display content.

In an implementation of the embodiments of the present disclosure, step 501 may include:

Step 1: The OLED panel and the reflecting LCD panel are manufactured respectively. The reflecting LCD panel comprises a bottom substrate.

Step 2: After the bottom substrate is stripped off the reflecting LCD pane, the LCD panel is made to adhere to the OLED panel.

It means that the OLED panel and the reflecting LCD panel are manufactured in advance respectively and assembled later. The complexity of the manufacturing procedure is low.

Wherein, the LCD panel manufacturing includes: manufacturing the lower substrate, manufacturing the upper substrate; box-aligning the upper and lower substrates.

Wherein, the lower substrate manufacturing includes: providing a bottom substrate, manufacturing a soft substrate on the bottom substrate, manufacturing the pixel electrode on the soft substrate. The upper substrate manufacturing includes: providing a bottom substrate, manufacturing a color blocking layer, a black matrix, and other structures on the bottom substrate. The box-alignment of upper substrate and lower substrate includes: preparing and implementing alignment; spreading and anchoring separators; preparing the frame sealant, etc.

Before the reflecting LCD panel manufacturing, this method also includes the OLED panel manufacturing. The OLED panel manufacturing includes: manufacturing a substrate; manufacturing an anode, a luminescent layer, a cathode, and an encapsulation layer in sequence on the substrate.

In the implementation, step 502 may include:

After the reflecting LCD panel adheres to the OLED panel, the pixel electrode of the reflecting LCD panel is connected to the TFT circuit on the OLED panel through the wires arranged outside of the encapsulation layer of the OLED panel. The TFT circuit is connected to the drive circuit. The drive circuit is connected to the pixel electrode through the external wires.

In another implementation of the embodiments of the present disclosure, step 501 may include:

At the first step: OLED panel is manufactured.

At the second step: The reflecting LCD panel is manufactured on the OLED panel.

In the above manufacturing method, the OLED panel is manufactured first, then the reflecting LCD panel is manufactured on the OLED panel so that the manufacturing procedures are fewer and the manufacturing time is shorter.

Wherein, the manufacturing the reflecting LCD panel on the OLED panel includes: manufacturing the pixel electrode on the OLED panel; manufacturing the upper substrate; box aligning the OLED panel and the upper substrate. The upper substrate manufacturing includes: providing a bottom substrate, manufacturing the color blocking layer, the black matrix, and other structures on the bottom substrate.

In the implementation, the liquid crystal in the reflecting LCD panel is aligned through mixing polymers. Since the alignment of the liquid crystal in the reflecting LCD panel is implemented through mixing polymers, the OLED panel can be prevented from being damaged if the regular alignment technology is applied.

Therefore, the OLED panel and the upper substrate alignment may include: implementing the alignment through mixing polymers; spreading and anchoring separators; preparing the frame sealant, etc.

In the implementation, step 502 may include:

After the reflecting LCD panel is manufactured, the pixel electrode of the reflecting LCD panel is connected to the TFT circuit on the OLED panel through the wires set up outside of the encapsulation layer of the OLED panel; or before the reflecting LCD panel is manufactured, manufacturing the VIAs on the OLED panel. During the reflecting LCD panel manufacturing, connecting the pixel electrode of the reflecting LCD panel to the TFT circuit on the OLED panel through the VIAs; connecting the TFT circuit to the drive circuit. The drive circuit is connected to the pixel electrode through the external wires or VIAs.

In the embodiments of the present disclosure, the external wiring can be done through bonding (as shown in FIG. 6) or printing conductive silver paste with an inkjet printer. That is to say, the external wires can connect the drive circuit to the pixel electrode through bonding, or the external wires can print conductive silver paste with an inkjet printer between the drive circuit and the pixel electrode so as to connect them together.

Figure 9:
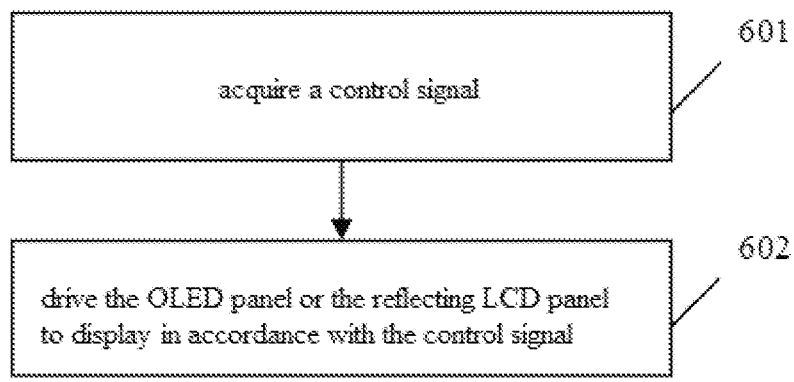
FIG. 9 is a flow diagram of a method of driving a display panel of the embodiments of the present disclosure.

FIG. 9 is a flow diagram of a method of driving a display panel provided by the embodiments of the present disclosure. The method is used to drive the display panel shown in FIG. 1. Referring to FIG. 9, the method comprises:

At step 601, acquiring a control signal.

At step 602, driving the OLED panel or the reflecting LCD panel to display content in accordance with the control signal.

The present disclosure solves the issue of display approach of current display devices being relatively uniform by putting the OLED panel and the reflecting LCD panel together and controlling the OLED panel or the reflecting LCD panel to display content through the drive circuit.

In an implementation of the embodiments of the present disclosure, the acquiring the control signal may include:

acquiring a user's input command; generating the control signal based on the user's input command; or, acquiring brightness of external environment light; generating the control signal based on the brightness of the external environment light.

switching display between the OLED and the LCD based on user's input or external environment light to manually or automatically control the display panel.

Wherein, the generating the control signal based on the brightness of external environment light may include:

generating a control signal for controlling the display of the reflecting LCD panel, when the brightness of external environment light is greater than a preset value; generating a control signal for controlling the display of the OLED panel, when the brightness of external environment light is less than a preset value.

Since the reflecting LCD panel can utilize the reflection of the environment light as the backlight, when the brightness of external environment light is relatively high, the reflecting LCD panel is used for display because the reflecting LCD panel does not have backlight and the energy required by backlight is saved so that the power consumption is low; when the brightness of external environment light is relatively low, the OLED panel can be used for display to prevent the display panel from being unable to display content when only the reflecting LCD panel is used; the display approach to use the combination of the reflecting LCD panel and the OLED panel can let the display panel select the reflecting LCD panel for display when the environment light brightness is high and OLED panel for display when the environment light brightness is low so that the average power consumption is lower than that of a regular LCD and OLED.

Further, when the reflecting LCD panel is the TN LCD panel shown in FIG. 3, the method may further comprising:

inputting a common signal to the common electrode of the reflecting LCD panel when the reflecting LCD panel displays content, wherein voltage of the common signal is the voltage of the common electrode.

When the reflecting LCD panel is the IPS or ADS LCD panel shown in FIG. 2, the method may further comprising:

inputting a common signal to the anode when the reflecting LCD panel displays content, wherein voltage of the common signal is the voltage of the common electrode; inputting an anode signal to the anode when the OLED panel displays content, wherein the anode signal is used to drive the luminescent layer of the OLED panel to emit light. Reusing the common electrode of the LCD panel and the anode of the OLED panel can reduce the thickness of the display panel and save materials.

The embodiments of the present disclosure further provide a non-transitory readable storage medium comprising instructions executed on a processing component for performing the method of driving the display panel shown in FIG. 9.

The foregoing are only preferred embodiments of the present disclosure, and do not intend to limit the disclosure. Within the spirit and principles of the disclosure, any modifications, equivalent substitutions, improvements, etc., are protected within the scope of the present disclosure.

What is claimed is:

1. A display panel comprising: an OLED panel comprising an anode and a reflecting LCD panel arranged in a laminated mode, and a drive circuit, wherein the drive circuit is connected to the OLED panel and the reflecting LCD panel respectively; and the drive circuit is used to drive the OLED panel or the reflecting LCD panel to display content in accordance with a control signal;

wherein no common electrode is arranged in the reflecting LCD panel, and the anode is used as a common electrode of the reflecting LCD panel when the reflecting LCD panel displays content.

2. The display panel of claim 1, further comprising: a controller connected to the drive circuit; and the controller acquires a user's input command; and generates the control signal based upon the user's input command; or, acquire brightness of external environment light; and generate the control signal based upon the brightness of the external environment light.

3. The display panel of claim 1, wherein the OLED panel further comprises a substrate, a luminescent layer, and a cathode arranged on the substrate in sequence and the encapsulation layer arranged on the substrate to encapsulate the anode, the luminescent layer, and the cathode;

the reflecting LCD panel comprises pixel electrode, an upper substrate, and liquid crystal arranged between the pixel electrode and the upper substrate, the pixel electrode is arranged above the encapsulation layer; and the cathode of the OLED panel is the reflecting layer of the reflecting LCD panel.

4. The display panel of claim 3, wherein the reflecting LCD panel is an In Plane Switch LCD panel or an Advanced-Super Dimensional Switching LCD panel, the drive circuit is used to input a common signal to the anode when the reflecting LCD displays, voltage of the common signal is the voltage of the common electrode; an anode signal is input to the anode when the OLED panel displays, the anode signal is used to drive the luminescent layer.

5. The display panel of claim 3, wherein the substrate comprises a bottom substrate and a TFT circuit arranged on the bottom substrate; and the TFT circuit includes a plurality of parallel gate lines, a plurality of parallel data lines, a plurality of first transistors, a plurality of selective circuits, and a plurality of second transistors; the gate lines and data lines are arranged across each other; a first transistor, a selective circuit, and a second transistor are placed at the crossing of each gate line and each data line; a gate of the first transistor is connected to the gate line, and a source of the first transistor is connected to the data line, a drain of the first transistor is connected to input end of the selective circuit; a first output end of the selective circuit is connected to a gate of the second transistor, a second output end of the selective circuit is connected to the pixel electrode, a control end of the selective circuit is connected to the drive circuit, the selective is used to connect the input end to the first output end or to the second output end with the control signal; a source of the second transistor is connected to the power voltage; a drain of the second transistor is connected to the anode; both the gate lines and the data lines are connected to the drive circuit.

6. The display panel of claim 5, wherein the selective circuit comprises P-type metal-oxide semiconductor field effect P-MOS transistor and an N-type metal-oxide semiconductor field effect N-MOS transistor; a gate of the P-MOS transistor and a gate of the -MOS transistor are connected to the drive circuit simultaneously to receive the control signal transmitted from the drive circuit, a source of the P-MOS transistor and a source of the N-MOS transistor are connected to the drain of the first transistor simultaneously, a drain of the N-MOS transistor is connected to the pixel electrode, and a drain of the P-MOS transistor is connected to gate of the second transistor.

7. The display panel of claim 5, wherein the TFT circuit is connected to the pixel electrode through wires arranged outside the encapsulation layer; or,
the encapsulation layer is provided with VIAs, and the TFT circuit is connected to the pixel electrode through the VIAs.

8. A display apparatus, wherein the display apparatus comprises the display panel of claim 1.

9. A method of manufacturing a display panel, comprising:
arranging an OLED panel comprising an anode and a reflecting LCD panel in a laminated mode; and
connecting the OLED panel and the reflecting LCD panel to a drive circuit for driving the OLED panel or the reflecting LCD panel to display content in accordance with a control signal,
wherein no common electrode is arranged independently in the reflecting LCD panel, and the anode is used as a common electrode of the reflecting LCD panel when the reflecting LCD panel displays content.

10. The method of claim 9, wherein the arranging the OLED panel and the reflecting LCD panel in a laminated mode comprises:
manufacturing the OLED panel and the reflecting LCD panel respectively, wherein the reflecting LCD panel comprises a bottom substrate; and
stripping the bottom substrate off the reflecting LCD panel, and laminating the stripped LCD panel with the OLED panel.

11. The method of claim 9, wherein the arranging the OLED panel and the reflecting LCD panel in a laminated mode comprises:

manufacturing the reflecting LCD panel on the OLED panel.

12. The method of claim 9, wherein the connecting the OLED panel and the reflecting LCD panel to the drive circuit comprises:
connecting the pixel electrode of the reflecting LCD panel to the TFT circuit on the OLED panel through wires arranged outside the encapsulation layer, wherein the TFT circuit is connected to the drive circuit.

13. The method of claim 11, wherein the connecting the OLED panel and the reflecting LCD panel to the drive circuit comprises:
manufacturing VIAs on the OLED panel before the reflecting LCD panel is manufactured, connecting the pixel electrode of the reflecting LCD panel to the TFT circuit on the OLED panel through the VIAs when manufacturing the reflecting LCD panel, wherein the TFT circuit is connected to the drive circuit.

14. A method of driving the display panel, wherein the display panel comprises an OLED panel comprising an anode and a reflecting LCD panel arranged in a laminated mode, and a drive circuit, the drive circuit is connected to the OLED panel and the reflecting LCD panel respectively; the method comprising
acquiring a control signal; and
driving the OLED panel or the reflecting LCD panel to display content in accordance with a control signal,
wherein no common electrode is arranged independently in the reflecting LCD panel, and the anode is used as a common electrode of the reflecting LCD panel when the reflecting LCD panel displays content.

15. The method of claim 14, wherein the acquiring a control signal comprises:
acquiring a control signal input by a user; or,
acquiring brightness of external environment, and generating a control signal in accordance with the brightness of external environment.

16. The method of claim 15, wherein the generating a control signal in accordance with brightness of external environment light comprises:
generating a control signal for controlling the display of the reflecting LCD panel, when the brightness of external environment light is greater than a preset value; and
generating a control signal for controlling the display of the OLED panel, when the brightness of external environment light is less than a preset value.

17. The method of claim 14, wherein the OLED panel further comprises a substrate, a luminescent layer, and a cathode arranged on the substrate in sequence and an encapsulation layer arranged on the substrate to encapsulate the anode, the luminescent layer, and the cathode; the reflecting LCD panel is a Twisted Nematic LCD panel and comprises the pixel electrode, an upper substrate, and liquid crystal arranged between the pixel electrode and the upper substrate, the pixel electrode is arranged on the encapsulation layer, the method further comprising:
inputting a common signal to the anode when the reflecting LCD panel displays, wherein voltage of the common signal is the voltage of the common electrode; and
inputting an anode drive signal to the anode when the OLED panel displays.

18. A non-transitory readable storage medium comprising instructions that, when executed on a processing component, cause the processing component to perform the method of driving the display panel of claim 14.

* * * * *